United States Patent

(12) United States Patent
Chung et al.

(10) Patent No.: US 11,145,697 B2
(45) Date of Patent: Oct. 12, 2021

(54) ORGANIC LIGHT EMITTING DISPLAY DEVICE

(71) Applicant: Samsung Display Co., LTD., Yongin-si (KR)

(72) Inventors: Jinkoo Chung, Suwon-si (KR); Gunhee Kim, Hwaseong-si (KR); Kyungho Kim, Seoul (KR); Seong-Min Kim, Yongin-si (KR); Eunkyoung Nam, Hwaseong-si (KR); Chaungi Choi, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/864,049

(22) Filed: Jan. 8, 2018

(65) Prior Publication Data
US 2018/0233547 A1 Aug. 16, 2018

(30) Foreign Application Priority Data

Feb. 10, 2017 (KR) .......................... 10-2017-0018742

(51) Int. Cl.
*H01L 27/32* (2006.01)

(52) U.S. Cl.
CPC ...... *H01L 27/3246* (2013.01); *H01L 27/3258* (2013.01); *H01L 27/326* (2013.01); *H01L 27/3248* (2013.01)

(58) Field of Classification Search
CPC ............ H01L 27/3258; H01L 27/3248; H01L 27/326; H01L 27/3295; H01L 27/3283; H01L 21/30635; H01L 27/3262
See application file for complete search history.

(56) References Cited

U.S. PATENT DOCUMENTS 8,354,980 B2 * 1/2013 Kwak .................. H01L 27/322
345/76
8,513,652 B2 * 8/2013 Ko ......................... H01L 51/56
257/40

(Continued)

FOREIGN PATENT DOCUMENTS

KR 0611220 B1 8/2006
KR 1020070054806 A 5/2007

(Continued)

OTHER PUBLICATIONS

European Search Report for European Patent Application No. 18155440.3-1211 dated Jul. 13, 2018.

*Primary Examiner* — Latanya N Crawford Eason
(74) *Attorney, Agent, or Firm* — Cantor Colburn LLP

(57) ABSTRACT

An organic light emitting display device includes a substrate including an emission region and a non-emission region, an organic light emitting element which emits light, the organic light emitting element including a first electrode disposed on the substrate in the emission region, an organic light emitting layer disposed on the first electrode in the emission region, and a second electrode disposed on the organic light emitting layer, and a via insulation layer disposed on the substrate in the non-emission region thereof, the via insulation layer including an organic insulation material. The via insulation layer defines an opening therein in which the organic light emitting layer of the organic light emitting element is disposed.

20 Claims, 8 Drawing Sheets

(56) References Cited

U.S. PATENT DOCUMENTS

| | | | |
|---|---|---|---|
| 2003/0189210 A1* | 10/2003 | Yamazaki | G02F 1/136227 257/72 |
| 2005/0263757 A1* | 12/2005 | Lee | H01L 27/3211 257/40 |
| 2010/0097295 A1* | 4/2010 | Kwak | H01L 27/322 345/32 |
| 2011/0140114 A1* | 6/2011 | Ko | H01L 27/3244 257/59 |
| 2012/0168758 A1* | 7/2012 | Jin | H01L 27/3246 257/59 |
| 2013/0175533 A1* | 7/2013 | Lee | H01L 27/3248 257/59 |
| 2014/0078120 A1 | 3/2014 | Lee et al. | |
| 2014/0139102 A1* | 5/2014 | Jeon | H01L 27/3246 313/504 |
| 2014/0151651 A1* | 6/2014 | Jin | H01L 51/5209 257/40 |
| 2014/0312319 A1 | 10/2014 | Kim | |
| 2015/0069343 A1* | 3/2015 | You | H01L 27/3248 257/40 |
| 2015/0102316 A1* | 4/2015 | Park | H01L 27/3258 257/40 |
| 2015/0115256 A1* | 4/2015 | You | H01L 27/3265 257/40 |
| 2015/0243890 A1 | 8/2015 | Fang et al. | |
| 2016/0064685 A1* | 3/2016 | Kim | B32B 3/266 257/40 |
| 2016/0104858 A1* | 4/2016 | You | H01L 27/3258 257/40 |
| 2016/0149154 A1* | 5/2016 | Park | H01L 51/5209 257/40 |
| 2017/0294451 A1* | 10/2017 | Kim | H01L 27/124 |
| 2018/0138435 A1* | 5/2018 | Kim | H01L 51/5056 |

FOREIGN PATENT DOCUMENTS

| | | |
|---|---|---|
| KR | 1020160055333 A | 5/2016 |
| KR | 1020160068537 A | 6/2016 |
| KR | 1020160076688 A | 7/2016 |
| WO | 2009079327 A1 | 6/2009 |

* cited by examiner

ORGANIC LIGHT EMITTING DISPLAY DEVICE

This application claims priority to Korean Patent Application No. 10-2017-0018742, filed on Feb. 10, 2017, and all the benefits accruing therefrom under 35 U.S.C. § 119, the content of which in its entirety is herein incorporated by reference.

BACKGROUND

1. Field

Embodiments relate to display devices. More particularly, embodiments relate to organic light emitting display devices.

2. Description of the Related Art

An organic light emitting display device may have an organic light emitting element including a hole injection layer, an electron injection layer, and an organic light emitting layer formed therebetween. In the organic light emitting display device, light may be generated as excitons, which are the combination of holes injected from the hole injection layer and electrons injected from the electron injection layer, fall from an excited state to a ground state.

The organic light emitting display device may not include a separate light source to generate light, and thus the organic light emitting display device may have relatively small thickness and light weight as well as relatively low power consumption. Furthermore, the organic light emitting display device may have relatively wide viewing angle, high contrast and high response speed, etc.

SUMMARY

One or more embodiment provides an organic light emitting display device for preventing damage of an organic light emitting layer.

One or more embodiment provides an organic light emitting display device for reducing or effectively preventing damage of an organic light emitting element.

An organic light emitting display device according to one or more embodiment includes a substrate including an emission region and a non-emission region, an organic light emitting element which emits light, the organic light emitting element including a first electrode disposed on the substrate in the emission region, an organic light emitting layer disposed on the first electrode in the emission region, and a second electrode disposed on the organic light emitting layer, and a via insulation layer disposed on the substrate in the non-emission region thereof, the via insulation layer including an organic insulation material. The via insulation layer defines an opening therein in which the organic light emitting layer of the organic light emitting element is disposed.

In an embodiment, a maximum height of a top surface of the via insulation layer from the substrate may be greater than a height of a bottom surface of a center portion of the first electrode from the substrate.

In an embodiment, the organic light emitting display device may further include a transistor connected to the organic light emitting element in the emission region of the substrate, the transistor disposed on the substrate in the non-emission region.

In an embodiment, from the substrate, the height of the bottom surface of the center portion of the first electrode may be disposed at same height as a drain electrode of the transistor.

In an embodiment, the organic light emitting display device may further include a passivation layer including an inorganic insulation material the passivation layer disposing the via insulation layer between the passivation layer and the substrate.

In an embodiment, the passivation layer may extend along a top surface and a sidewall of the via insulation layer.

In an embodiment, the passivation layer may be disposed only in the non-emission region.

In an embodiment, the passivation layer may be disposed in the non-emission region and in the emission region.

In an embodiment, the organic light emitting display device may further include a passivation layer disposed between the substrate and the via insulation layer, the passivation layer including an inorganic insulation material.

In an embodiment, the passivation layer may be disposed only in the non-emission region.

In an embodiment, the passivation layer may be disposed in the non-emission region and in the emission region.

An organic light emitting display device according to one or more embodiment includes a substrate, a plurality of sub-pixels disposed on the substrate, the plurality of sub-pixels each including an organic light emitting element, and a via insulation layer disposed on the substrate in each of the sub-pixels including the organic light emitting element, the via insulation layer including an organic insulation material. The via insulation layer defines an opening therein in which the organic light emitting element of at least one sub-pixel among the plurality of sub-pixels is disposed.

In an embodiment, the plurality of sub-pixels may include a blue sub-pixel, a green sub-pixel, and a red sub-pixel. The organic light emitting element of the blue sub-pixel may be disposed in the opening of the via insulation layer.

In an embodiment, the organic light emitting display device may further include a passivation layer disposed between the via insulation layer and the organic light emitting element, the passivation layer including an inorganic insulation material.

In an embodiment, the passivation layer may extend along a top surface and a sidewall of the via insulation layer.

In an embodiment, the passivation layer may define an opening in which the organic light emitting element of the at least one sub-pixel is disposed.

In an embodiment, the passivation layer may be disposed between the organic light emitting element of the at least one sub-pixel and the substrate.

In an embodiment, the organic light emitting display device may further include a passivation layer disposed between the substrate and the via insulation layer, the passivation layer including an inorganic insulation material.

In an embodiment, the passivation layer may define an opening in which the organic light emitting element of the at least one sub-pixel is disposed.

In an embodiment, the passivation layer may be disposed between the organic light emitting element of the at least one sub-pixel and the substrate.

The organic light emitting display device according to one or more embodiment may include the via insulation layer which may not overlap the organic light emitting layer, therefore, damage to the organic light emitting layer may be reduced or effectively prevented. The organic light emitting display device according to one or more embodiment may include the via insulation layer which may not overlap the organic light emitting element of at least one sub-pixel, therefore, damage to the organic light emitting element may be reduced or effectively prevented.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
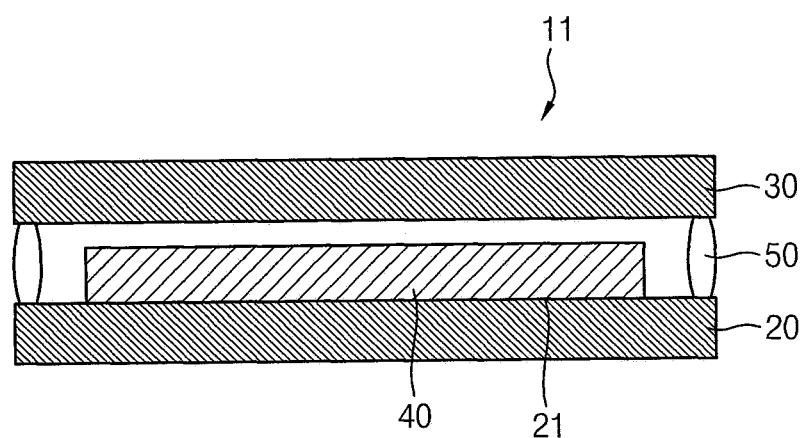
FIG. 1 is a cross-sectional side view illustrating an embodiment of an organic light emitting display device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, organic light emitting display devices in accordance with embodiments of the present disclosure will be explained in detail with reference to the accompanying drawings.

An organic light emitting display device may include a display panel which generates an image with light. The display panel may include an organic light emitting element which generates the light for displaying the image, a transistor which drives the organic light emitting element to generate the light for displaying the image, and a via insulation layer. The via insulation layer may protect the transistor which drives the organic light emitting element and may planarize a top surface of the transistor within the display panel. The via insulation layer may include organic material.

The via insulation layer including the organic material may generate an outgas due to relatively short-term or long-term chemical dissolution thereof. The outgas may be undesirably injected into an organic light emitting layer of the organic light emitting element, so that damages such as a dark spot, a pixel shrinkage, etc. may undesirably occur.

FIG. 1 is a cross-sectional side view illustrating an embodiment of an organic light emitting display device according to the invention.

Referring to FIG. 1, an organic light emitting display device 11 according to an embodiment may include a (base) substrate 20, an encapsulation substrate 30, and a display member 40. The substrate 20, the encapsulation substrate 30, and the display member 40 may together define a display panel of the organic light emitting display device. Such display panel may be disposed relative to other components of the organic light emitting display device, including but not limited to, a receiving container, cover, etc.

The substrate 20 may include transparent material such as glass or plastic. The display member 40 may be disposed on the substrate 20. The display member 40 may generate and display an image with light. In an embodiment, for example, the display member 40 may be disposed on a center portion of a first surface 21 of the substrate 20. The display member 40 may be on the first surface 21 to be disposed spaced apart from ends or outer edges of the substrate 20. The display member 40 may display the image toward the substrate 20 and/or the encapsulation substrate 30.

The encapsulation substrate 30 may be disposed on the display member 40. The encapsulation substrate 30 may face the first surface 21 of the substrate 20 with respect to the display member 40. The encapsulation substrate 30 may have substantially the same material as the substrate 20. The encapsulation substrate 30 may block impurities outside thereof, from penetrating into the display member 40.

An (outer) edge portion of the substrate 20 and an (outer) edge portion of the encapsulation substrate 30 may be combined to each other by a sealing member 50. A space between the substrate 20 and the encapsulation substrate 30 may be encapsulated by the sealing member 50. A moisture absorbing member or a filling member may be disposed in the space.

Figure 2:
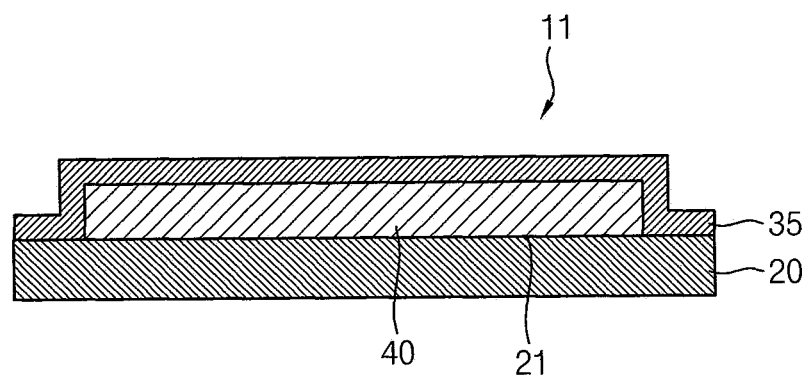
FIG. 2 is a cross-sectional side view illustrating another embodiment of an organic light emitting display device according to the invention.

FIG. 2 is a cross-sectional side view illustrating another embodiment of an organic light emitting display device according to the invention.

Referring to FIG. 2, an organic light emitting display device 11 according to another embodiment may include a (base) substrate 20, an encapsulation thin film 35, and a display member 40.

As illustrated in FIG. 2, the encapsulation thin film 35 may be disposed on the display member 40 instead of the encapsulation substrate 30 (refer to FIG. 1). The encapsulation thin film 35 may protect the display member 40 from impurities similar to that described above for the encapsulation substrate 30. The encapsulation thin film 35 may have a structure in which at least one inorganic layer and at least one organic layer are alternately layered. However, the structure of the encapsulation thin film 35 is not limited thereto, and any transparent encapsulation structure may be applied which protects the display member 40 from impurities.

Figure 3:
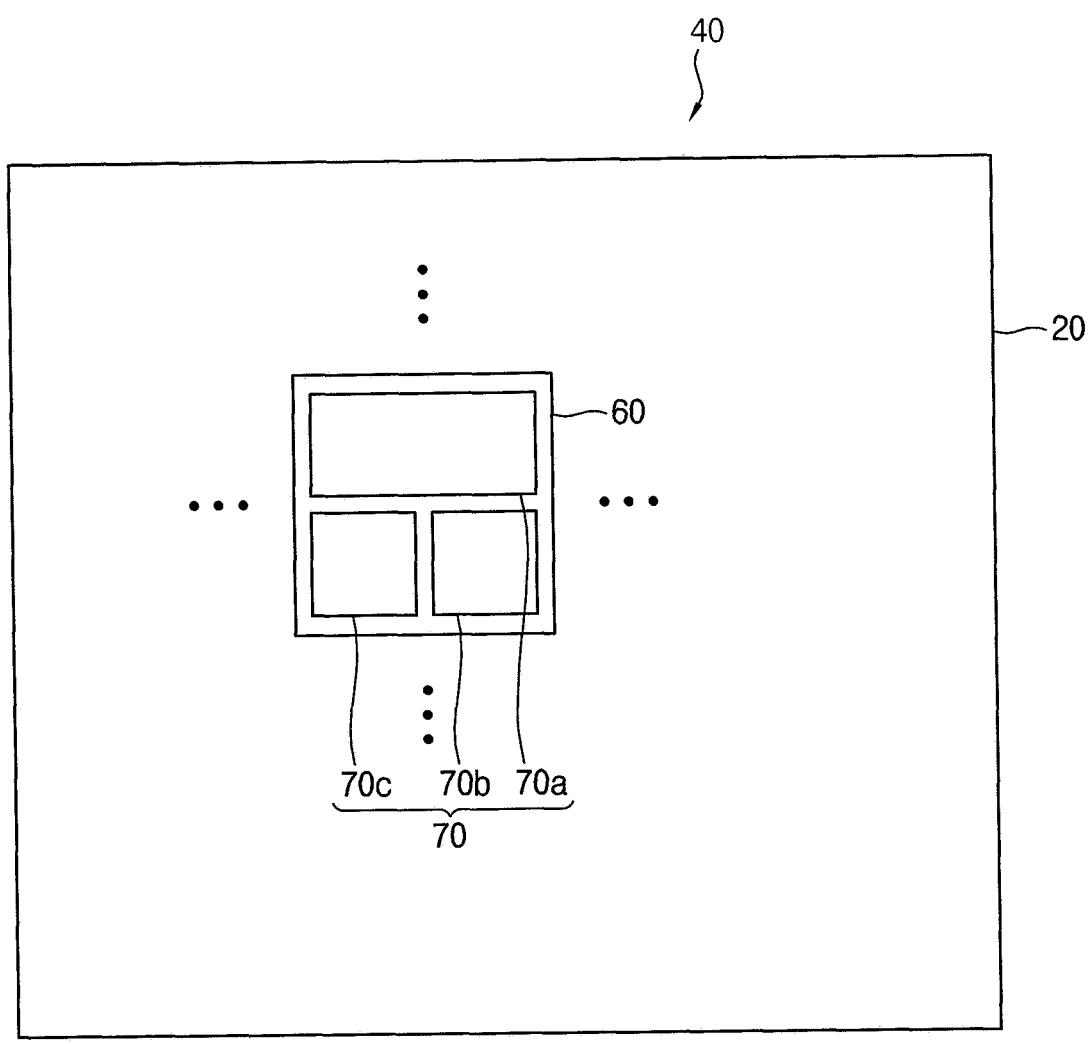
FIG. 3 is a top plan view illustrating an embodiment of a display member of the organic light emitting display device in FIG. 1.

FIG. 3 is a top plan view illustrating an embodiment of the display member of the organic light emitting display device in FIG. 1. The display member illustrated in FIG. 3 may also be applied to the organic light emitting display device in FIG. 2.

Referring to FIG. 3, the display member 40 may include a unit pixel 60 provided in plurality (indicated by the ●●● disposed at each side of the unit pixel 60 in FIG. 3). The unit pixels 60 may be arranged along a first direction and a second direction, which cross each other. The first direction and the second direction may be substantially parallel to the substrate 20. The first direction and the second direction may define a plane which is parallel to the plane in which the substrate 20 and/or the first surface 21 thereof are disposed. The first direction and the second direction may be substantially orthogonal to each other in the top plan view, but the invention is not limited thereto. A thickness of the organic light emitting display device is taken in a third direction which crosses each of the first and second directions. The cross-sectional views of FIGS. 1 and 2 are defined in the third (thickness) direction, and another direction in the plane parallel to the plane in which the substrate 20 and/or the first surface 21 thereof are disposed, such as the first or second direction.

Each unit pixel 60 may include a plurality of sub-pixels 70. Light generated at or transmitted through the sub-pixels 70 may be emitted from each of the sub-pixels 70. In an embodiment, each unit pixel 60 may include a first sub-pixel 70a, a second sub-pixel 70b, and a third sub-pixel 70c. However, the number of the sub-pixels 70 within a single unit pixel 60 is not limited thereto, and each unit pixel 60 may include two, four or more sub-pixels 70.

In an embodiment, the first sub-pixel 70a, the second sub-pixel 70b, and the third sub-pixel 70c may emit blue light, green light and red light, respectively. Each unit pixel 60 may display a particular color by combining lights emitted from individual sub-pixels such as the first sub-pixel 70a, the second sub-pixel 70b, and the third sub-pixel 70c.

Figure 4:
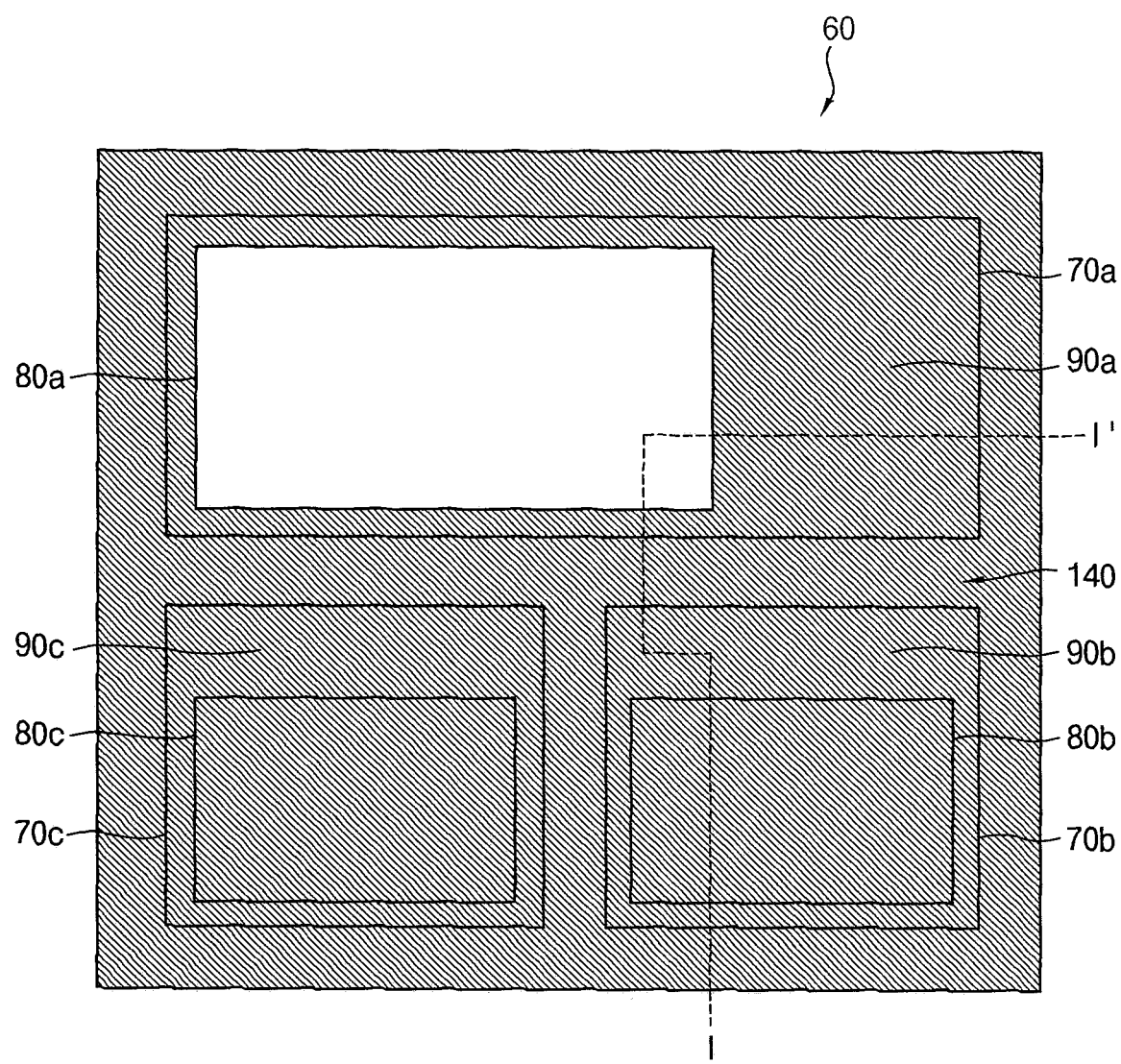
FIG. 4 is an enlarged top plan view illustrating an embodiment of a unit pixel of the display member in FIG. 3.

FIG. 4 is an enlarged top plan view illustrating an embodiment of a unit pixel of the display member in FIG. 3.

Referring to FIG. 4, each of the sub-pixels 70 may include an emission region and a non-emission region. The first sub-pixel 70a may include a first emission region 80a and a first non-emission region 90a. The second sub-pixel 70b may include a second emission region 80b and a second non-emission region 90b. The third sub-pixel 70c may include a third emission region 80c and a third non-emission region 90c. The sub-pixels 70 each including the emission region and the non-emission region may be spaced apart from each other (refer to FIG. 4) or may be directly adjacent to each other (refer to FIG. 5, for example).

Light may be emitted from the emission region. In an embodiment, for example, blue light may be emitted from the first emission region 80a, green light may be emitted from the second emission region 80b, and red light may be emitted from the third emission region 80c.

The non-emission region of a sub-pixel may be adjacent to the emission region thereof. In an embodiment, for example, the non-emission region may surround the emission region in the top plan view, that is, be disposed at all sides of the emission region. Referring to FIG. 4, for example, the first non-emission region 90a may surround the first emission region 80a, the second non-emission region 90b may surround the second emission region 80b, and third non-emission region 90c may surround the third emission region 80c.

A via insulation layer 140 may not overlap the emission region of at least one sub-pixel among the plurality of sub-pixels 70. In an embodiment, the via insulation layer 140 may not overlap the first emission region 80a of the first sub-pixel 70a among the first sub-pixel 70a, the second sub-pixel 70b and the third sub-pixel 70c. However, in another embodiment, the via insulation layer 140 may not overlap the second emission region 80b of the second sub-pixel 70b or the third emission region 80c of the third sub-pixel 70c, among the first sub-pixel 70a, the second sub-pixel 70b and the third sub-pixel 70c. A detail of the via insulation layer 140 will be explained below with reference to FIG. 5.

Figure 5:
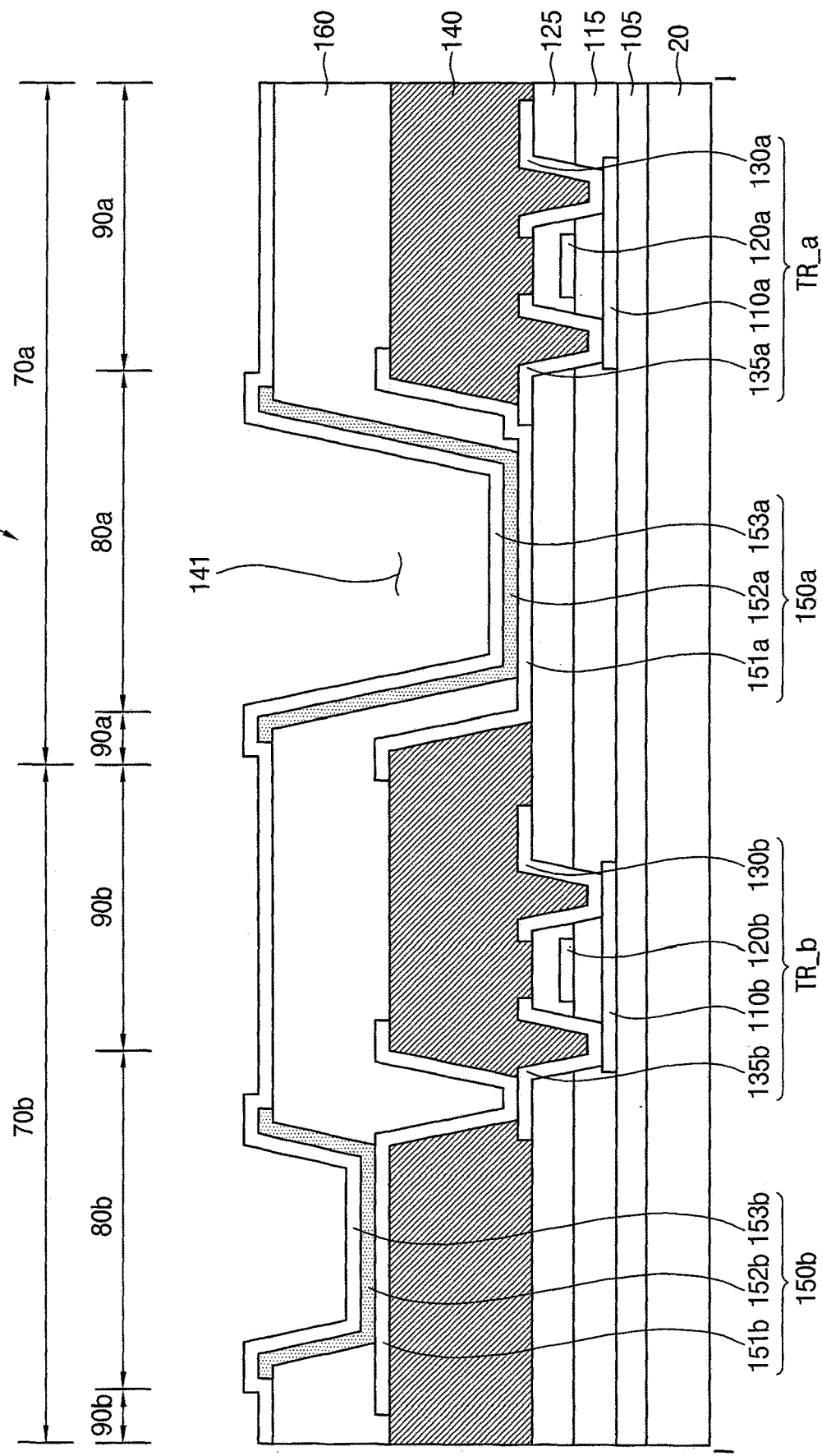
FIG. 5 is an enlarged cross-sectional view illustrating an embodiment of an organic light emitting display device according to the invention.

FIG. 5 is an enlarged cross-sectional view illustrating an embodiment of an organic light emitting display device according to the invention. For example, FIG. 5 may be an enlarged cross-sectional view illustrating an organic light emitting display device 11 according to the invention, taken along line I-I' in FIG. 4.

Referring to FIG. 5, an organic light emitting display device 11 according to an embodiment may include a substrate 20, transistors TR_a and TR_b, a via insulation layer 140, and organic light emitting elements 150a and 150b. The transistors TR_a and TR_b may be disposed on the substrate 20. The via insulation layer 140 may cover the transistors TR_a and TR_b. The organic light emitting elements 150a and 150b may be disposed on the substrate 20.

The substrate 20 may include a collective emission region and a collective non-emission region, defined by these respective regions of the sub-pixels 70. FIG. 5 illustrates only the first sub-pixel 70a, which includes the first emission region 80a and the first non-emission region 90a, and the second sub-pixel 70b, which includes the second emission region 80b and the second non-emission region 90b. However, the third sub-pixel 70c, which includes the third emission region 80c and the third non-emission region 90c, may be also disposed on the substrate 20. The third sub-pixel 70c may have substantially the same element or structure as the first sub-pixel 70a or the second sub-pixel 70b. Therefore, a description on the third sub-pixel 70c may be omitted.

A buffer layer 105 may be disposed on the substrate 20, between the transistors and the substrate 20. The buffer layer 105 may have a flat surface facing the transistors, and may block a penetration of impurities from outside the organic light emitting display device 11. The buffer layer 105 may include an inorganic insulation material such as silicon oxide (SiOx), silicon nitride (SiNx), silicon oxynitride (SiOxNy), or the like. In an alternative embodiment, the buffer layer 105 may be omitted.

A first transistor TR_a and a second transistor TR_b may be disposed on the substrate 20. The first transistor TR_a may supply a driving (electrical) current to a first organic light emitting element 150a, and the second transistor TR_b may supply a driving (electrical) current to a second organic light emitting element 150b. The first transistor TR_a may include a first active pattern 110a, a first gate electrode 120a, a first source electrode 130a and a first drain electrode 135a. The second transistor TR_b may include a second active pattern 110b, a second gate electrode 120b, a second source electrode 130b, and a second drain electrode 135b. In an embodiment, the first transistor TR_a may be disposed in the first non-emission region 90a.

The first active pattern 110a and the second active pattern 110b may be disposed on the buffer layer 105. The first active pattern 110a and the second active pattern 110b may include semiconductor material. In an embodiment, for example, the first active pattern 110a and the second active pattern 110b may include amorphous silicon, polycrystalline silicon, oxide semiconductor, or the like. Each of the first active pattern 110a and the second active pattern 110b may include or define a source region, a drain region, and a channel region disposed therebetween.

A gate insulation layer 115 may be disposed on the buffer layer 105. The gate insulation layer 115 may cover the first active pattern 110a and the second active pattern 110b. The gate insulation layer 115 may include an inorganic insulation material such as silicon oxide (SiOx), silicon nitride (SiNx), silicon oxynitride (SiOxNy), or the like. The gate insulation layer 115 may insulate the first gate electrode 120a from the first active pattern 110a, and may insulate the second gate electrode 120b from the second active pattern 110b.

The first gate electrode 120a and the second gate electrode 120b may be disposed on the gate insulation layer 115. The first gate electrode 120a may overlap the channel region of the first active pattern 110a. The second gate electrode 120b may overlap the channel region of the second active pattern 110b. The first gate electrode 120a and the second gate electrode 120b may include a metal material such as molybdenum (Mo), aluminum (Al), copper (Cu), titanium (Ti), or the like.

An insulation interlayer 125 may be disposed on the gate insulation layer 115. The insulation interlayer 125 may cover the first gate electrode 120a and the second gate electrode 120b. The insulation interlayer 125 may include an inorganic insulation material such as silicon oxide (SiOx), silicon nitride (SiNx), silicon oxynitride (SiOxNy), or the like.

The first source electrode 130a, the first drain electrode 135a, the second source electrode 130b and the second drain electrode 135b may be disposed on the insulation interlayer 125. The first source electrode 130a and the first drain electrode 135a may be in contact with the source region and the drain region of the first active pattern 110a, respectively, through contact holes in the insulation interlayer 125 and in the gate insulation layer 115. The second source electrode 130b and the second drain electrode 135b may be in contact with the source region and the drain region of the second active pattern 110b, respectively, through contact holes in the insulation interlayer 125 and in the gate insulation layer 115. The first source electrode 130a, the first drain electrode 135a, the second source electrode 130b, and the second drain electrode 135b may include a metal such as molybdenum (Mo), aluminum (Al), copper (Cu), titanium (Ti), or the like.

The via insulation layer 140 may be disposed on the insulation interlayer 125. The via insulation layer 140 may be common to each of the sub-pixels 70 and to each of the unit pixels 60. The via insulation layer 140 may cover the first transistor TR_a and the second transistor TR_b. In an embodiment, for example, the via insulation layer 140 may cover the first source electrode 130a, the first drain electrode 135a, the second source electrode 130b, and the second drain electrode 135b. The via insulation layer 140 may have a flat top surface so as to alleviate an uneven surface derived from the first transistor TR_a and the second transistor TR_b, and so as to reduce or effectively prevent the occurrence of failure of structures within the organic light emitting display device 11 disposed on the via insulation layer 140. The via insulation layer 140 may include an organic insulation material such as polyimide (PI). The via insulation layer 140 may not overlap the first emission region 80a, among the emission regions in a unit pixel 60. In other words, the via insulation layer 140 may not be disposed in the first emission region 80a.

The via insulation layer 140 may include or define an opening portion 141 and a contact hole. The opening portion 141 may be disposed or formed in the first emission region 80*a*, and may expose a portion of the insulation interlayer 125 and a portion of the first drain electrode 135*a* in the first emission region 80*a*. The contact hole may be disposed or formed on the second drain electrode 135*b*, and may expose a portion of the second drain electrode 135*b*.

In an embodiment of manufacturing the organic light emitting display device 11, the via insulation layer 140 may be formed by using a photolithography process. In an embodiment, a photosensitive organic insulation material layer may be formed on the insulation interlayer 125, and then the organic insulation material layer may be exposed and developed by using a mask so as to form the via insulation layer 140 including the opening portion 141 and the contact hole. A portion of the organic insulation material layer may be removed to form the opening portion 141, thus, a total volume of the via insulation layer 140 may decrease as compared to a via insulation layer which excludes the opening portion 141 at an emission region. Accordingly, since the total volume of the via insulation layer 140 including the opening portion 141 is decreased, the amount of outgas generated from the via insulation layer 140 may decrease.

The first organic light emitting element 150*a* and the second organic light emitting element 150*b* may be disposed on the substrate 20. The first organic light emitting element 150*a* may be electrically connected to the first transistor TR_a, and the second organic light emitting element 150*b* may be electrically connected to the second transistor TR_b. The first organic light emitting element 150*a* may include a first pixel electrode 151*a*, a first organic light emitting layer 152*a* and a first common electrode 153*a*. The second organic light emitting element 150*b* may include a second pixel electrode 151*b*, a second organic light emitting layer 152*b* and a second common electrode 153*b*. The first organic light emitting element 150*a* may be disposed in the first emission region 80*a*, and the second organic light emitting element 150*b* may be disposed in the second emission region 80*b*. The first and second common electrodes 153*a* and 153*b* may be portions of a single common electrode disposed common to each of the sub-pixels 70 and the unit pixels 60, but the invention is not limited thereto.

As described above, the via insulation layer 140 may not be disposed (e.g., is excluded) in the first emission region 80*a*. Therefore, the via insulation layer 140 may not be disposed under the first organic light emitting element 150*a*, and the first organic light emitting element 150*a* may be disposed directly on the insulation interlayer 125 including the inorganic insulation material. Because the first transistor TR_a is disposed in the first non-emission region 90*a* with the via insulation layer 140 disposed thereon, although the via insulation layer 140 is not disposed under the first organic light emitting element 150*a* in the first emission region 80*a*, damage to the first organic light emitting element 150*a* due to an uneven surface thereunder (such as what could be derived from the underlying first transistor TR_a in the first sub-pixel 70*a*) may not occur.

Each of the first pixel electrode 151*a* and the second pixel electrode 151*b* may be patterned as an island shape discrete pattern shape. At the opening portion 141, a center (e.g., non-edge) portion of the first pixel electrode 151*a* may be disposed on or at the insulation interlayer 125, and an edge portion of the first pixel electrode 151*a* may be disposed on or at a sidewall and a top surface of the via insulation layer 140. The first pixel electrode 151*a* may be in contact with the first drain electrode 135*a* through the opening portion 141 in the via insulation layer 140. The second pixel electrode 151*b* may be disposed on the via insulation layer 140, and may be in contact with the second drain electrode 135*b* through the contact hole in the via insulation layer 140. The first pixel electrode 151*a* and the second pixel electrode 151*b* may include a metal and/or transparent conductive material.

In an embodiment, a height of the via insulation layer 140 at a top surface thereof may be greater than a height of the first pixel electrode 151*a* at a bottom surface of the center portion thereof. Each of the height of the top surface of the via insulation layer 140 and the height of the bottom surface of the center portion of the first pixel electrode 151*a* may be a height from a common reference, such as the substrate 20. In an embodiment, for example, the height at the top surface of the via insulation layer 140 may be a sum of a thickness of the buffer layer 105, a thickness of the gate insulation layer 115, a thickness of the insulation interlayer 125, and a thickness of the via insulation layer 140. The height at the bottom surface of the center portion of the first pixel electrode 151*a* may be a sum of a thickness of the buffer layer 105, a thickness of the gate insulation layer 115, and a thickness of the insulation interlayer 125. Therefore, the height at the top surface of the via insulation layer 140 may be greater than the height at the bottom surface of the center portion of the first pixel electrode 151*a*, by the thickness of the via insulation layer 140. The thicknesses and heights described above, may be a maximum value of those dimensions, taken from the common reference.

In an embodiment, the height of the first pixel electrode 151*a* at the center portion thereof may be substantially the same as a height of the first drain electrode 135*a* of the first transistor TR_a. In an embodiment, for example, the center portion of the first pixel electrode 151*a* and the first drain electrode 135*a* may be disposed on or at a top surface of the insulation interlayer 125. Therefore, the height of the first pixel electrode 151*a* at the center portion thereof and the height of the first drain electrode 135*a* may be substantially the same.

A pixel defining layer 160 may be disposed on the via insulation layer 140. The pixel defining layer 160 may cover an edge portion of the first pixel electrode 151*a* and an edge portion of the second pixel electrode 151*b*. The pixel defining layer 160 may expose the center portion of the first pixel electrode 151*a* and the center portion of the second pixel electrode 151*b* so as to define the first emission region 80*a* and the second emission region 80*b*. The pixel defining layer 160 may include organic insulation material such as polyimide (PI). The pixel defining layer 160 may be disposed common to each of the sub-pixels 70 and the unit pixels 60, but the invention is not limited thereto.

The first organic light emitting layer 152*a* and the second organic light emitting layer 152*b* may be disposed on the first pixel electrode 151*a* and the second pixel electrode 151*b*, respectively. When the first sub-pixel 70*a* is a blue sub-pixel and the second sub-pixel 70*b* is a green sub-pixel as described above, the first organic light emitting layer 152*a* may emit blue light and the second organic light emitting layer 152*b* may emit green light.

The first organic light emitting layer 152*a* may not overlap the via insulation layer 140. In an embodiment, for example, the via insulation layer 140 may not be disposed under the first organic light emitting layer 152*a*. That is, a maximum thickness of the via insulation layer 140 may not be disposed under the first organic light emitting layer 152*a*.

In a comparative example, an organic light emitting layer of an organic light emitting element may be damaged by an outgas generated from a via insulation layer when the via insulation layer is substantially disposed under the organic light emitting layer. However, in one or more embodiment according to the invention, the via insulation layer 140 may not be disposed under the first organic light emitting layer 152a. Thus, although an outgas is emitted from the via insulation layer 140 disposed in the non-emission region of the first sub-pixel 70a, the first organic light emitting layer 152a thereof may not be influenced by such outgas. Accordingly, damage of the first organic light emitting layer 152a of the first sub-pixel 70a due to the outgas may be reduced or effectively prevented.

The first common electrode 153a may face the first pixel electrode 151a with respect to the first organic light emitting layer 152a, and the second common electrode 153b may face the second pixel electrode 151b with respect to the second organic light emitting layer 152b. The first common electrode 153a and the second common electrode 153b may be integrally formed, that is, disposed common to each of the sub-pixels 70. The first common electrode 153a and the second common electrode 153b may include a metal and/or transparent conductive material.

Figure 6:
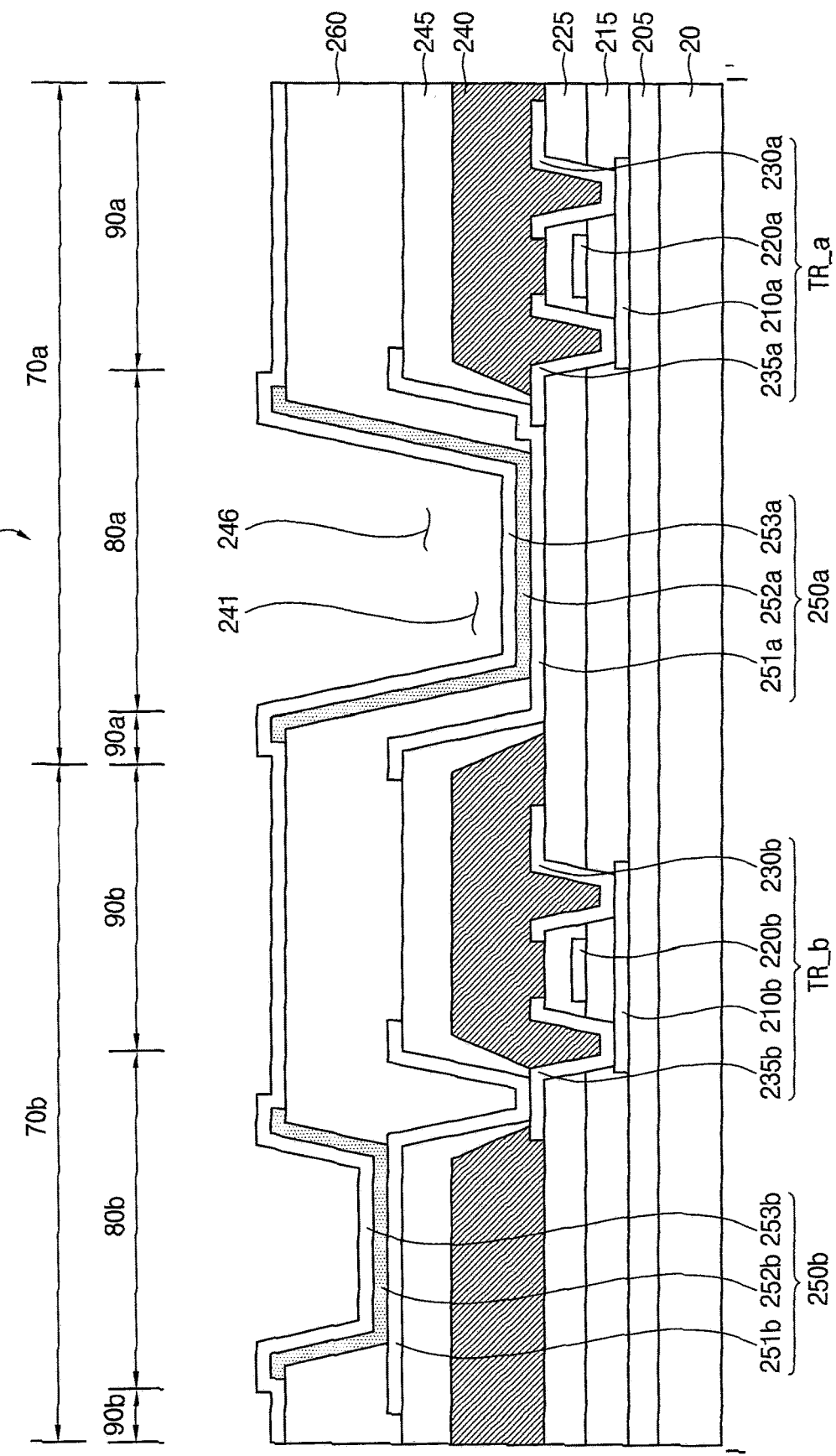
FIG. 6 is an enlarged cross-sectional view illustrating another embodiment of an organic light emitting display device according to the invention.

FIG. 6 is an enlarged cross-sectional view illustrating another embodiment of an organic light emitting display device according to the invention. For example, FIG. 6 may be an enlarged cross-sectional view illustrating an embodiment of an organic light emitting display device 12 taken along line I-I' in FIG. 4.

Referring to FIG. 6, an organic light emitting display device 12 according to another embodiment may include a substrate 20, transistors TR_a and TR_b, a via insulation layer 240, a passivation layer 245, and organic light emitting elements 250a and 250b. The transistors TR_a and TR_b may be disposed on the substrate 20. A gate insulation layer 215 may be disposed on the buffer layer 205. The first transistor TR_a may include a first active pattern 210a, a first gate electrode 220a, a first source electrode 230a and a first drain electrode 235a. The second transistor TR_b may include a second active pattern 210b, a second gate electrode 220b, a second source electrode 230b, and a second drain electrode 235b. The first organic light emitting element 250a may include a first pixel electrode 251a, a first organic light emitting layer 252a and a first common electrode 253a. The second organic light emitting element 250b may include a second pixel electrode 251b, a second organic light emitting layer 252b and a second common electrode 253b.

The via insulation layer 240 may cover the transistors TR_a and TR_b. The passivation layer 245 may cover the via insulation layer 240. The passivation layer 245 may be disposed common to each of the sub-pixels 70 and the unit pixels 60, but the invention is not limited thereto. The organic light emitting elements 250a and 250b may be disposed on the substrate 20. Detailed explanations on elements and/or structures of the organic light emitting display device 12 illustrated in FIG. 6, which are substantially the same as or similar to those of the organic light emitting display device 11 illustrated in FIG. 5 may be omitted.

The via insulation layer 240 may be disposed on the insulation interlayer 225. The via insulation layer 240 may include a first opening portion 241 and a first contact hole. The first opening portion 241 may be disposed or formed in the first emission region 80a, and may expose a portion of the insulation interlayer 225 and a portion of the first drain electrode 235a in the first emission region 80a. The first contact hole may be disposed or formed on the second drain electrode 235b, and may expose a portion of the second drain electrode 235b.

The passivation layer 245 may be disposed on the via insulation layer 240. The passivation layer 245 may include an inorganic insulation material such as silicon oxide (SiOx), silicon nitride (SiNx), silicon oxynitride (SiOxNy), or the like. The passivation layer 245 may not overlap the first emission region 80a. In other words, the passivation layer 245 may not be disposed in the first emission region 80a.

In an embodiment, the passivation layer 245 may cover a top surface and a sidewall of the via insulation layer 240. Therefore, a permeation of outgas emitted from the via insulation layer 240 to other elements of the organic light emitting display device 12 may be blocked by the passivation layer 245, and the passivation layer 245 may serve as a blocking layer against the outgas.

The passivation layer 245 may include or define a second opening portion 246 and a second contact hole. The second opening portion 246 may be disposed or formed in the first emission region 80a, and may expose a portion of the insulation interlayer 225 and a portion of the first drain electrode 235a in the first emission region 80a. In an embodiment, for example, the second opening portion 246 may be disposed or formed inside the first opening portion 241 of the via insulation layer 240. The second contact hole may be disposed or formed on the second drain electrode 235b, and may expose a portion of the second drain electrode 235b. In an embodiment, for example, the second contact hole may be disposed or formed inside the first contact hole.

In an embodiment of manufacturing the organic light emitting display device 12, the via insulation layer 240 and the passivation layer 245 may be formed by using a photolithography process. In an embodiment, a photosensitive organic insulation material layer may be formed on the insulation interlayer 225, and then the organic insulation material layer may be exposed and developed by using a first mask so as to form the via insulation layer 240 including the first opening portion 241 and the first contact hole.

An inorganic insulation material layer and a photoresist layer may be sequentially formed on the via insulation layer 240, and then the photoresist layer may be exposed and developed by using a second mask and the inorganic insulation material layer may be etched so as to form the passivation layer 245 including the second opening portion 246 and the second contact hole. A portion of the organic insulation material layer may be removed to form the first opening portion 241 of the via insulation layer 240 and the inorganic insulation material layer may be formed thereon, thus, a total volume of the via insulation layer 240 may decrease as compared to a via insulation layer which excludes the opening portion 241 at an emission region. Accordingly, since the total volume of the via insulation layer 240 including the opening portion 241 is decreased, the amount of outgas generated from the via insulation layer 240 may decrease.

Each of the first pixel electrode 251a and the second pixel electrode 251b may be patterned as an island shape. At the first and second opening portions 241 and 246, a center (e.g., non-edge) portion of the first pixel electrode 251a may be disposed on the insulation interlayer 225, and an edge portion of the first pixel electrode 251a may be disposed on or at a sidewall and a top surface of the passivation layer 245. The first pixel electrode 251a may be in contact with the first drain electrode 235a through the second opening portion 246. The second pixel electrode 251b may be disposed on the passivation layer 245, and may be in contact with the second drain electrode 235b through the second contact hole. The pixel defining layer 260 may be disposed on the passivation layer 245.

As described above, the via insulation layer 240 may not be disposed in the first emission region 80a. Therefore, the via insulation layer 240 may not be disposed under the first organic light emitting element 250a, and the first organic light emitting element 250a may be disposed directly on the insulation interlayer 225 including the inorganic insulation material. Because the first transistor TR_a is disposed in the first non-emission region 90a, although the via insulation layer 240 is not disposed under the first organic light emitting element 250a in the first emission region 80a, damage to the first organic light emitting element 250a due to an uneven surface thereunder may not occur.

Figure 7:
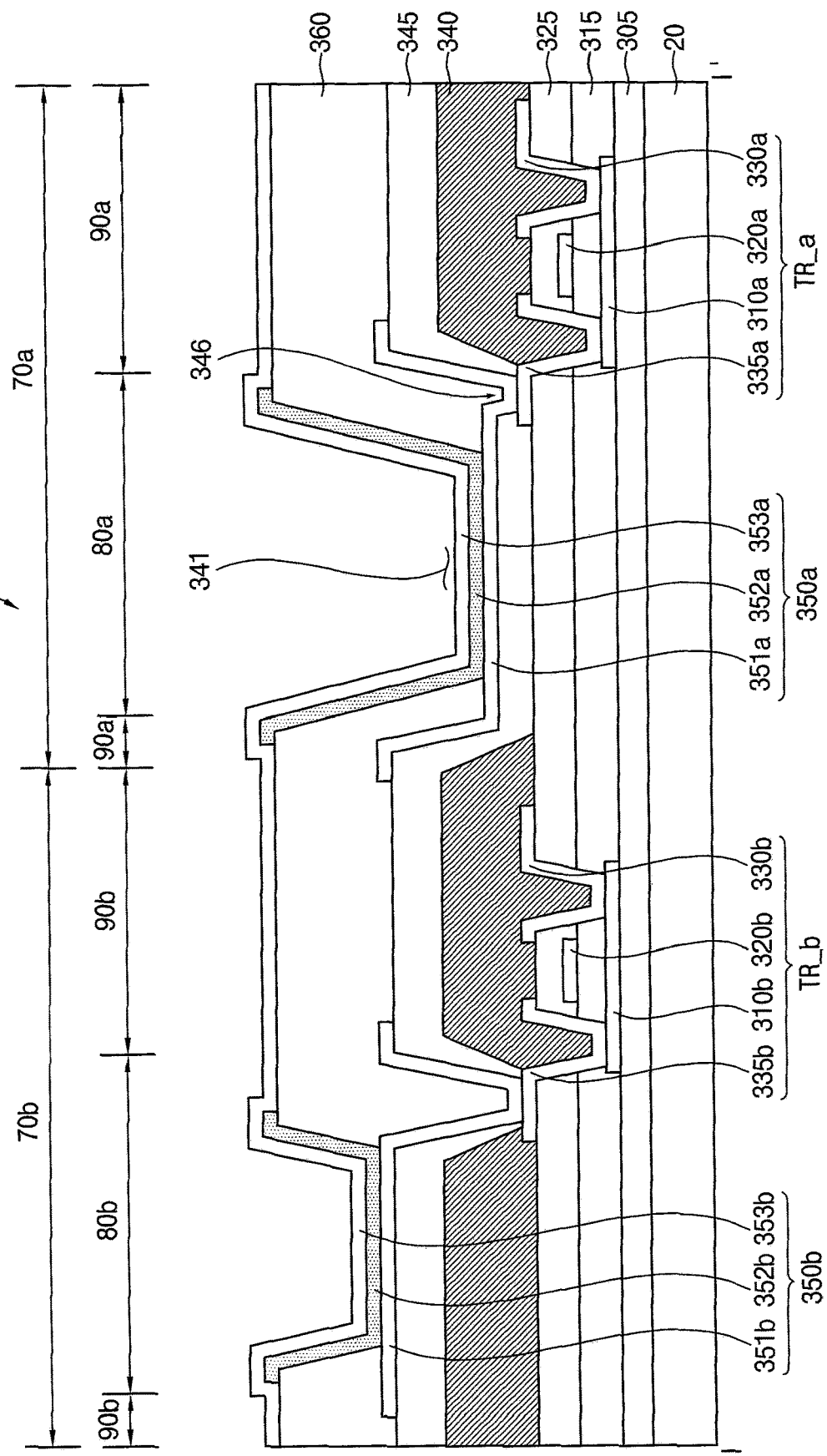
FIG. 7 is an enlarged cross-sectional view illustrating still another embodiment of an organic light emitting display device according to the invention.

FIG. 7 is an enlarged cross-sectional view illustrating still another embodiment of an organic light emitting display device according to the invention. In an embodiment, for example, FIG. 7 may be an enlarged cross-sectional view illustrating an embodiment of an organic light emitting display device 13 taken along line I-I' in FIG. 4.

Referring to FIG. 7, an organic light emitting display device 13 according to still another embodiment may include a substrate 20, transistors TR_a and TR_b, a via insulation layer 340, a passivation layer 345, and organic light emitting elements 350a and 350b. A gate insulation layer 315 may be disposed on the buffer layer 305. The transistors TR_a and TR_b may be disposed on the substrate 20. The first transistor TR_a may include a first active pattern 310a, a first gate electrode 320a, a first source electrode 330a and a first drain electrode 335a. The second transistor TR_b may include a second active pattern 310b, a second gate electrode 320b, a second source electrode 330b, and a second drain electrode 335b. The first organic light emitting element 350a may include a first pixel electrode 351a, a first organic light emitting layer 352a and a first common electrode 353a. The second organic light emitting element 350b may include a second pixel electrode 351b, a second organic light emitting layer 352b and a second common electrode 353b.

The via insulation layer 340 may cover the transistors TR_a and TR_b. The passivation layer 345 may cover the via insulation layer 340. The organic light emitting elements 350a and 350b may be disposed on the substrate 20. Detailed explanations on elements and/or structures of the organic light emitting display device 13 illustrated in FIG. 7, which are substantially the same as or similar to those of the organic light emitting display device 12 illustrated in FIG. 6 may be omitted.

The passivation layer 345 may be disposed on the via insulation layer 340. The passivation layer 345 may overlap the first emission region 80a in contrast with the passivation layer 245 illustrated in FIG. 6. In other words, the passivation layer 345 may be disposed in the first emission region 80a as well as the first non-emission region 90a, the second emission region 80b and the second non-emission region 90b. The passivation layer 345 may have an entirely substantially uniform thickness according to a profile of the via insulation layer 340 and the insulation interlayer 325 disposed thereunder.

The passivation layer 345 may include a third contact hole 346 and a second contact hole. The third contact hole 346 may be disposed or formed on the first drain electrode 335a, and may expose a portion of the first drain electrode 335a.

The second contact hole may be formed on the second drain electrode 335b, and may expose a portion of the second drain electrode 335b.

In an embodiment of manufacturing the organic light emitting display device 13, the via insulation layer 340 and the passivation layer 345 may be formed by using a photolithography process. In an embodiment, a photosensitive organic insulation material layer may be formed on the insulation interlayer 325, and then the organic insulation material layer may be exposed and developed by using a first mask so as to form the via insulation layer 340 including the opening portion 341 and the first contact hole therein. An inorganic insulation material layer and a photoresist layer may be sequentially formed on the via insulation layer 340, and then the photoresist layer may be exposed and developed by using a second mask and the inorganic insulation material layer may be etched so as to form the passivation layer 345 including the third contact hole 346 and the second contact hole therein. A portion of the organic insulation material layer may be removed to form the opening portion 341 of the via insulation layer 340 and the inorganic insulation material layer may be formed thereon, thus, a total volume of the via insulation layer 340 may decrease as compared to a via insulation layer which excludes the opening portion 341 at an emission region. Accordingly, since the total volume of the via insulation layer 340 including the opening portion 341 is decreased, the amount of outgas generated from the via insulation layer 340 may decrease.

Each of the first pixel electrode 351a and the second pixel electrode 351b may be patterned as an island shape. At the opening portion 341, a center (e.g., non-edge) portion of the first pixel electrode 351a may be disposed on the passivation layer 345 positioned inside the opening portion 341, and an edge portion of the first pixel electrode 351a may be disposed on or at a sidewall and a top surface of the passivation layer 345. The first pixel electrode 351a may be in contact with the first drain electrode 335a through the third contact hole 346. The second pixel electrode 351b may be disposed on the passivation layer 345, and may be in contact with the second drain electrode 335b through the second contact hole. The pixel defining layer 360 may be disposed on the passivation layer 345.

As described above, the via insulation layer 340 may not be disposed in the first emission region 80a. Therefore, the via insulation layer 340 may not be disposed under the first organic light emitting element 350a, and the first organic light emitting element 350a may be disposed directly on the passivation layer 345 including the inorganic insulation material. Because the first transistor TR_a is disposed in the first non-emission region 90a, although the via insulation layer 340 is not disposed under the first organic light emitting element 350a in the first emission region 80a, damage to the first organic light emitting element 350a due to an uneven surface thereunder may not occur.

Figure 8:
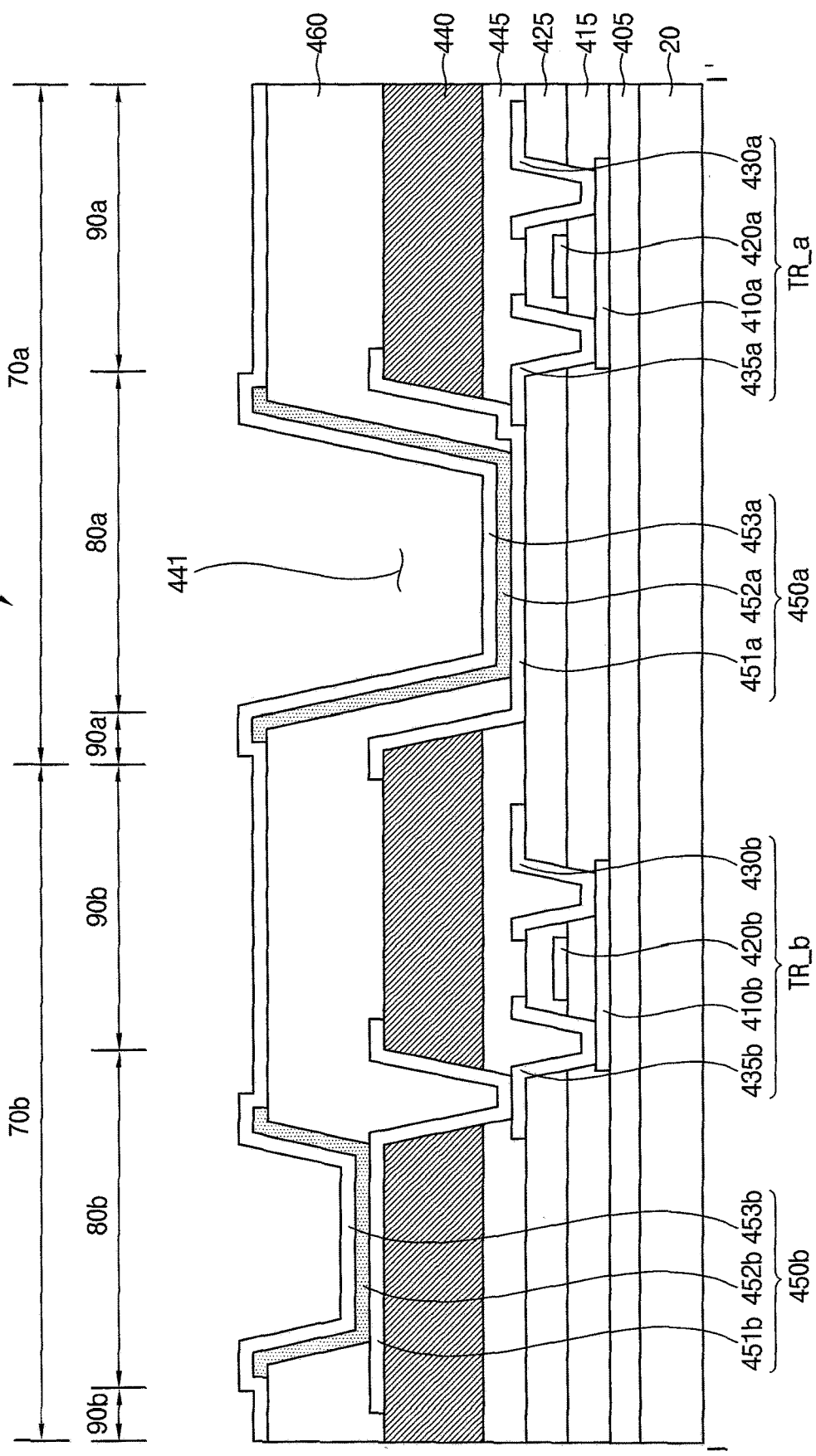
FIG. 8 is an enlarged cross-sectional view illustrating yet another embodiment of an organic light emitting display device according to the invention.

FIG. 8 is an enlarged cross-sectional view illustrating yet another embodiment of an organic light emitting display device according to the invention. In an embodiment, for example, FIG. 8 may be an enlarged cross-sectional view illustrating an embodiment of an organic light emitting display device 14 taken along line I-I' in FIG. 4.

Referring to FIG. 8, an organic light emitting display device 14 according to yet another embodiment may include a substrate 20, transistors TR_a and TR_b, a passivation layer 445, a via insulation layer 440, and organic light emitting elements 450a and 450b. A gate insulation layer 415 may be disposed on the buffer layer 405. The transistors TR_a and TR_b may be disposed on the substrate 20. The passivation layer 445 may cover the transistors TR_a and TR_b. The first transistor TR_a may include a first active pattern 410a, a first gate electrode 420a, a first source electrode 430a and a first drain electrode 435a. The second transistor TR_b may include a second active pattern 410b, a second gate electrode 420b, a second source electrode 430b, and a second drain electrode 435b. The first organic light emitting element 450a may include a first pixel electrode 451a, a first organic light emitting layer 452a and a first common electrode 453a. The second organic light emitting element 450b may include a second pixel electrode 451b, a second organic light emitting layer 452b and a second common electrode 453b.

The via insulation layer 440 may be disposed on the passivation layer 445. The organic light emitting elements 450a and 450b may be disposed on the substrate 20. Detailed explanations on elements and/or structures of the organic light emitting display device 14 illustrated in FIG. 8, which are substantially the same as or similar to those of the organic light emitting display device 11 illustrated in FIG. 5 may be omitted.

The passivation layer 445 may be disposed on the insulation interlayer 425. The passivation layer 445 may cover the first transistor TR_a and the second transistor TR_b. In an embodiment, for example, the passivation layer 445 may cover the first source electrode 430a, the first drain electrode 435a, the second source electrode 430b, and the second drain electrode 435b. The passivation layer 445 may include an inorganic insulation material such as silicon oxide (SiOx), silicon nitride (SiNx), silicon oxynitride (SiOxNy), or the like. The passivation layer 445 may not overlap the first emission region 80a. In other words, the passivation layer 445 may not be disposed in the first emission region 80a.

The via insulation layer 440 may be disposed on the passivation layer 445. The passivation layer 445 and the via insulation layer 440 may include or collectively define an opening portion 441 and a contact hole. The opening portion 441 may be disposed or formed in the first emission region 80a, and may expose a portion of the insulation interlayer 425 and a portion of the first drain electrode 435a in the first emission region 80a. The contact hole may be disposed or formed on the second drain electrode 435b, and may expose a portion of the second drain electrode 435b.

In an embodiment of manufacturing the organic light emitting display device 14, the passivation layer 445 and the via insulation layer 440 may be formed by using a photolithography process. In an embodiment, an inorganic insulation material layer and a photoresist layer may be sequentially formed on the insulation interlayer 425, and then the photoresist layer may be exposed and developed by using a first mask and the inorganic insulation material layer may be etched so as to form the passivation layer 445 including a portion of the opening portion 441 and a portion of the contact hole. A photosensitive organic insulation material layer may be formed on the passivation layer 445, and then the organic insulation material layer may be exposed and developed by using a second mask so as to form the via insulation layer 440 including a remainder of the opening portion 441 and a remainder of the contact hole.

In another embodiment of manufacturing the organic light emitting display device 14, an inorganic insulation material layer and a photosensitive organic insulation material layer may be sequentially formed on the insulation interlayer 425, and then the organic insulation material layer may be exposed and developed by using a mask and the inorganic insulation material layer may be etched so as to form the passivation layer 445 and the via insulation layer 440 which include a portion of the opening portion 441 and a portion of the contact hole. In this case, the via insulation layer 440 may serve as an etch-stop layer for the underlying inorganic insulation material layer. A portion of the organic insulation material layer may be removed to form the opening portion 441 and the inorganic insulation layer may be formed thereunder, thus, a total volume of the via insulation layer 440 may decrease as compared to a via insulation layer which excludes the opening portion 441 at an emission region. Accordingly, since the total volume of the via insulation layer 440 including the opening portion 441 is decreased, the amount of outgas generated from the via insulation layer 440 may decrease.

Each of the first pixel electrode 451a and the second pixel electrode 451b may be patterned as an island shape. At the opening portion 441, a center (e.g., non-edge) portion of the first pixel electrode 451a may be disposed on the insulation interlayer 425, and an edge portion of the first pixel electrode 451a may be disposed on or at a sidewall of the passivation layer 445, and a sidewall and a top surface of the via insulation layer 440. The first pixel electrode 451a may be in contact with the first drain electrode 435a through the opening portion 441. The second pixel electrode 451b may be disposed on the via insulation layer 440, and may be in contact with the second drain electrode 435b through the contact hole. The pixel defining layer 460 may be disposed on the via insulation layer 440.

As described above, the via insulation layer 440 may not be disposed in the first emission region 80a. Therefore, the via insulation layer 440 may not be disposed under the first organic light emitting element 450a, and the first organic light emitting element 450a may be disposed directly on the insulation interlayer 425 including inorganic insulation material. Because the first transistor TR_a is disposed in the first non-emission region 90a, although the via insulation layer 440 is not disposed under the first organic light emitting element 450a in the first emission region 80a, damage on the first organic light emitting element 450a due to an uneven surface thereunder may not occur.

Figure 9:
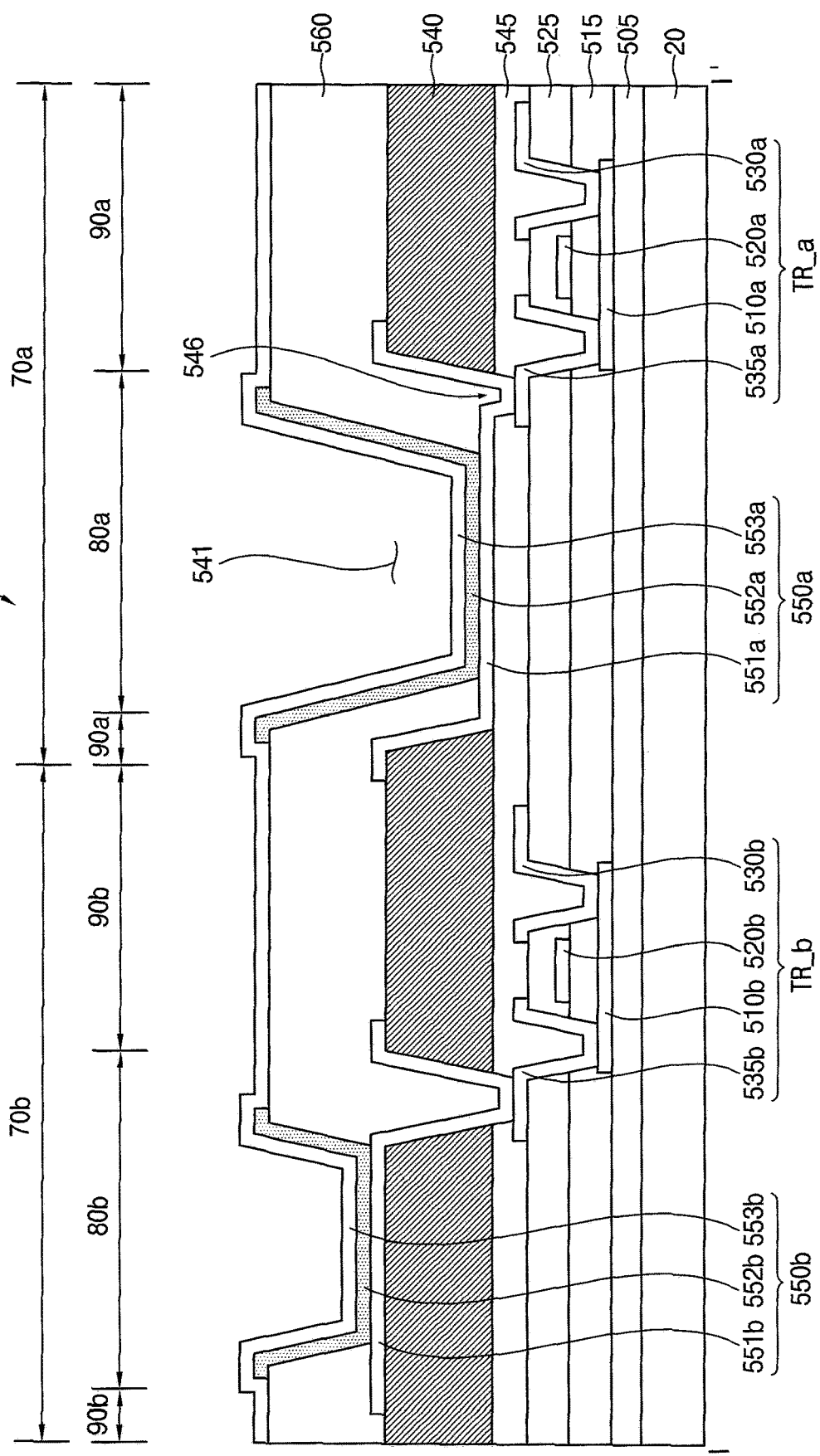
FIG. 9 is an enlarged cross-sectional view illustrating yet another embodiment of an organic light emitting display device according to the invention.

FIG. 9 is an enlarged cross-sectional view illustrating yet another embodiment of an organic light emitting display device according to the invention. In an embodiment, for example, FIG. 9 may be an enlarged cross-sectional view illustrating an embodiment of an organic light emitting display device 15 taken along line I-I' in FIG. 4.

Referring to FIG. 9, an organic light emitting display device 15 according to yet another embodiment may include a substrate 20, transistors TR_a and TR_b, a passivation layer 545, a via insulation layer 540, and organic light emitting elements 550a and 550b. A gate insulation layer 515 may be disposed on the buffer layer 505. The transistors TR_a and TR_b may be disposed on the substrate 20. The passivation layer 545 may cover the transistors TR_a and TR_b. The first transistor TR_a may include a first active pattern 510a, a first gate electrode 520a, a first source electrode 530a and a first drain electrode 535a. The second transistor TR_b may include a second active pattern 510b, a second gate electrode 520b, a second source electrode 530b, and a second drain electrode 535b. The first organic light emitting element 550a may include a first pixel electrode 551a, a first organic light emitting layer 552a and a first common electrode 553a. The second organic light emitting element 550b may include a second pixel electrode 551b, a second organic light emitting layer 552b and a second common electrode 553b.

The via insulation layer 540 may be disposed on the passivation layer 545. The organic light emitting elements 550a and 550b may be disposed on the substrate 20. Detailed explanations on elements and/or structures of the organic light emitting display device 15 illustrated in FIG. 9, which are substantially the same as or similar to those of the organic light emitting display device 14 illustrated in FIG. 8 may be omitted.

The passivation layer 545 may be disposed on the insulation interlayer 525. The passivation layer 545 may overlap the first emission region 80a in contrast with the passivation layer 445 illustrated in FIG. 8. In other words, the passivation layer 545 may be disposed in the first emission region 80a as well as the first non-emission region 90a, the second emission region 80b and the second non-emission region 90b.

The passivation layer 545 may include a first contact hole 546 and a portion of a second contact hole. The first contact hole 546 may be disposed or formed on the first drain electrode 535a, and may expose a portion of the first drain electrode 535a. The portion of the second contact hole may be disposed or formed on the second drain electrode 535b, and may expose a portion of the second drain electrode 535b.

The via insulation layer 540 may be disposed on the passivation layer 545. The via insulation layer 540 may include an opening portion 541 and a remainder of the second contact hole. The opening portion 541 may be disposed or formed in the first emission region 80a, and may expose a portion of the passivation layer 545 and a portion of the first drain electrode 535a in the first emission region 80a. The remainder of the second contact hole may be disposed or formed on the second drain electrode 535b, and may expose a portion of the second drain electrode 535b.

In an embodiment of manufacturing the organic light emitting display device 15, the passivation layer 545 and the via insulation layer 540 may be formed by using a photolithography process. In an embodiment, an inorganic insulation material layer and a photoresist layer may be sequentially formed on the insulation interlayer 525, and then the photoresist layer may be exposed and developed by using a first mask and the inorganic insulation material layer may be etched so as to form the passivation layer 545 including the first contact hole 546 and a portion of the second contact hole. A photosensitive organic insulation material layer may be formed on the passivation layer 545, and then the organic insulation material layer may be exposed and developed by using a second mask so as to form the via insulation layer 540 including the opening portion 541 and the remainder of the second contact hole. A portion of the organic insulation material layer may be removed to form the opening portion 541 and the inorganic insulation material layer may be formed thereunder, thus, a total volume of the via insulation layer 540 may decrease as compared to a via insulation layer which excludes the opening portion 541 at an emission region. Accordingly, since the total volume of the via insulation layer 540 including the opening portion 541 is decreased, the amount of outgas generated from the via insulation layer 540 may decrease.

Each of the first pixel electrode 551a and the second pixel electrode 551b may be patterned as an island shape. At the opening portion 541, a center portion of the first pixel electrode 551a may be disposed on the passivation layer 545, and an edge portion of the first pixel electrode 551a may be disposed on or at a sidewall and a top surface of the via insulation layer 540. The first pixel electrode 551a may be in contact with the first drain electrode 535a through the first contact hole 546. The second pixel electrode 551b may be disposed on the via insulation layer 540, and may be in contact with the second drain electrode 535b through the second contact hole. The pixel defining layer 560 may be disposed on the via insulation layer 540.

As described above, the via insulation layer 540 may not be disposed in the first emission region 80a. Therefore, the via insulation layer 540 may not be disposed under the first organic light emitting element 550a, and the first organic light emitting element 550a may be disposed directly on the passivation layer 545 including inorganic insulation material. Because the first transistor TR_a is disposed in the first non-emission region 90a, although the via insulation layer 540 is not disposed under the first organic light emitting element 550a in the first emission region 80a, damage on the first organic light emitting element 550a due to an uneven surface thereunder may not occur.

The organic light emitting display device according to one or more embodiments of the present disclosure may be applied to a display device included in a computer, a notebook, a mobile phone, a smartphone, a smart pad, a portable media player ("PMP"), a personal digital assistant ("PDA"), an MP3 player, or the like.

Although embodiments of the organic light emitting display devices according to the invention have been described with reference to the drawings, the illustrated embodiments are examples, and may be modified and changed by a person having ordinary knowledge in the relevant technical field without departing from the technical spirit of the present disclosure described in the following claims.

What is claimed is:

1. An organic light emitting display device, comprising:
a substrate comprising an emission region at which light is emitted and a non-emission region at which the light is not emitted;
a transistor disposed on the substrate in the non-emission region, the transistor comprising an active pattern and an electrode which is directly connected to the active pattern;
an organic light emitting element which is connected to the transistor at the electrode which is directly connected to the active pattern and emits light, the organic light emitting element comprising:
a first electrode disposed on the substrate in the emission region;
an organic light emitting layer disposed on the first electrode in the emission region; and
a second electrode disposed on the organic light emitting layer; and
a via insulation layer which defines an opening into which the electrode of the transistor extends to define an extended portion of the transistor which is exposed from the via insulation layer, the via insulation layer comprising an organic insulation material,
wherein
within the opening of the via insulation layer, the organic light emitting element is directly connected to the extended portion of the transistor,
the organic light emitting layer of the organic light emitting element is disposed in the opening to define a bottom surface of the organic light emitting layer which is in the opening and closest to the substrate, and
the via insulation layer which defines the opening does not overlap the bottom surface of the organic light emitting layer and does not contact the organic light emitting layer.

2. The organic light emitting display device of claim 1, wherein a maximum height of a top surface of the via insulation layer from the substrate is greater than a height of a bottom surface of a center portion of the first electrode from the substrate.

3. The organic light emitting display device of claim 1, wherein from the substrate, a height of a bottom surface of a center portion of the first electrode is disposed at a same height as the electrode of the transistor.

4. The organic light emitting display device of claim 1, further comprising a passivation layer comprising an inorganic insulation material,
wherein along a thickness direction of the substrate,
among the first and second electrodes of the organic light emitting element, the first electrode is closer to the transistor, and
both the passivation layer and the via insulation layer are between the first electrode of the organic light emitting element and the transistor, the via insulation layer being closer to the transistor than the passivation layer.

5. The organic light emitting display device of claim 4, wherein at the opening in the via insulation layer, the passivation layer extends along a top surface and a sidewall of the via insulation layer.

6. The organic light emitting display device of claim 4, wherein the passivation layer does not overlap the emission region.

7. The organic light emitting display device of claim 4, wherein the passivation layer is disposed in the non-emission region and in the emission region.

8. The organic light emitting display device of claim 1, further comprising a passivation layer comprising an inorganic insulation material,
wherein
the electrode of the transistor, the first electrode of the organic light emitting element, the organic light emitting layer of the organic light emitting element and the second electrode of the organic light emitting element are in order along a thickness direction of the substrate, and
along the thickness direction of the substrate, both the passivation layer and the via insulation layer are between the first electrode of the organic light emitting element and the electrode of the transistor, the passivation layer being closer to the electrode of the transistor than the via insulation layer.

9. The organic light emitting display device of claim 8, wherein the passivation layer does not overlap the emission region.

10. The organic light emitting display device of claim 8, wherein the passivation layer is disposed in the non-emission region and in the emission region.

11. An organic light emitting display device, comprising:
a substrate;
a plurality of sub-pixels disposed on the substrate, the plurality of sub-pixels each comprising an organic light emitting element which emits light and a transistor which is connected to the organic light emitting element and includes an active pattern and an electrode which is directly connected to the active pattern; and
a via insulation layer which defines an opening into which the electrode of the transistor extends to define an extended portion of the transistor which is exposed from the via insulation layer, the via insulation layer comprising an organic insulation material,
wherein
within the opening of the via insulation layer, the organic light emitting element is directly connected to the extended portion of the transistor,
the via insulation layer which defines the opening extends from the extended portion of the transistor and does not contact the organic light emitting layer,
the organic light emitting element of at least one sub-pixel among the plurality of sub-pixels is disposed in the opening, and
the via insulation layer does not overlap the organic light emitting element of the at least one sub pixel.

12. The organic light emitting display device of claim 11, wherein among the plurality of sub-pixels each comprising the organic light emitting element,
the plurality of sub-pixels comprises a blue sub-pixel, a green sub-pixel and a red sub-pixel, and
the organic light emitting element of the blue sub-pixel is disposed in the opening of the via insulation layer.

13. The organic light emitting display device of claim 11, further comprising a passivation layer comprising an inorganic insulation material,
wherein along a thickness direction of the substrate,
among the first and second electrodes of the organic light emitting element, the first electrode is closer to the transistor, and
both the passivation layer and the via insulation layer are between the first electrode of the organic light emitting element and the transistor, the via insulation layer being closer to the transistor than the passivation layer.

14. The organic light emitting display device of claim 13, wherein at the opening in the via insulation layer, the passivation layer extends along a top surface and a sidewall of the via insulation layer.

15. The organic light emitting display device of claim 13, wherein at the opening in the via insulation layer, the passivation layer defines an opening in which the organic light emitting element of the at least one sub-pixel is disposed.

16. The organic light emitting display device of claim 13, wherein at the opening in the via insulation layer, the passivation layer is disposed between the organic light emitting element of the at least one sub-pixel and the substrate.

17. The organic light emitting display device of claim 11, further comprising a passivation layer comprising an inorganic insulation material,
wherein along a thickness direction of the substrate,
among the first and second electrodes of the organic light emitting element, the first electrode is closer to the transistor, and
both the passivation layer and the via insulation layer are between the first electrode of the organic light emitting element and the transistor, the passivation layer being closer to the transistor than the via insulation layer.

18. The organic light emitting display device of claim 17, wherein at the opening in the via insulation layer, the passivation layer defines an opening in which the organic light emitting element of the at least one sub-pixel is disposed.

19. The organic light emitting display device of claim 17, wherein at the opening in the via insulation layer, the passivation layer is disposed between the first electrode of the organic light emitting element of the at least one sub-pixel and the substrate.

20. An organic light emitting display device, comprising:
a substrate;
a plurality of sub-pixels disposed on the substrate, the plurality of sub-pixels each comprising:
  an organic light emitting element which includes an organic light emitting layer and emits light, and
  a transistor which is connected to the organic light emitting element and includes an active pattern and an electrode which is directly connected to the active pattern; and
in each of the sub-pixels, a via insulation layer is disposed between the organic light emitting element and the transistor connected thereto, the via insulation layer comprising an organic insulation material,
wherein
in at least one sub-pixel among the plurality of sub-pixels, the via insulation layer between the organic light emitting element and the transistor connected thereto defines an opening into which the electrode of the transistor extends to define an extended portion of the transistor which is exposed from the via insulation layer,
within the opening of the via insulation layer, the organic light emitting element is directly connected to the extended portion of the transistor,
the via insulation layer which defines the opening extends from the extended portion of the transistor and does not contact the organic light emitting layer, and
the via insulation layer does not overlap the organic light emitting layer of the at least one sub pixel.

* * * * *